US010135018B2

(12) United States Patent
Seo et al.

(10) Patent No.: US 10,135,018 B2
(45) Date of Patent: Nov. 20, 2018

(54) ROLLABLE DISPLAY APPARATUS

(71) Applicant: SAMSUNG DISPLAY CO., LTD., Yongin-si, Gyeonggi-do (KR)

(72) Inventors: Taean Seo, Yongin-si (KR); Jinhwan Choi, Yongin-si (KR); Junghun Lee, Yongin-si (KR)

(73) Assignee: SAMSUNG ELECTRONICS CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/609,635

(22) Filed: May 31, 2017

(65) Prior Publication Data
US 2017/0373269 A1 Dec. 28, 2017

(30) Foreign Application Priority Data
Jun. 24, 2016 (KR) .......................... 10-2016-0079271

(51) Int. Cl.
| | |
|---|---|
| H05K 1/11 | (2006.01) |
| G09F 9/30 | (2006.01) |
| H05K 7/20 | (2006.01) |
| H01L 51/52 | (2006.01) |
| H01L 27/32 | (2006.01) |
| H01L 51/00 | (2006.01) |
| H05K 1/02 | (2006.01) |
| H05K 1/18 | (2006.01) |

(52) U.S. Cl.
CPC .......... *H01L 51/5237* (2013.01); *G09F 9/301* (2013.01); *H01L 27/3223* (2013.01); *H01L 27/3276* (2013.01); *H01L 51/0097* (2013.01); *H05K 1/0201* (2013.01); *H05K 1/111* (2013.01); *H05K 1/181* (2013.01); *H05K 7/20954* (2013.01); *H01L 27/3293* (2013.01); *H01L 2251/5338* (2013.01); *H05K 2201/10204* (2013.01)

(58) Field of Classification Search
CPC ..................................................... G06F 1/1652
See application file for complete search history.

(56) References Cited

U.S. PATENT DOCUMENTS

| | | | | |
|---|---|---|---|---|
| 7,397,179 | B2 | 7/2008 | Kim | |
| 7,786,951 | B2 * | 8/2010 | Huitema | G06F 1/1601 345/1.1 |
| 9,560,750 | B2 * | 1/2017 | Lee | H04M 1/0202 |
| 9,618,975 | B2 * | 4/2017 | Su | G06F 1/1652 |
| 9,756,757 | B2 * | 9/2017 | Park | G09F 9/301 |
| 9,864,412 | B2 * | 1/2018 | Park | G06F 1/1656 |

(Continued)

FOREIGN PATENT DOCUMENTS

| | | |
|---|---|---|
| KR | 10-2004-0059036 A | 7/2004 |
| KR | 10-2005-0017695 A | 2/2005 |

(Continued)

*Primary Examiner* — Robert J Hoffberg
(74) *Attorney, Agent, or Firm* — Lee & Morse P.C.

(57) ABSTRACT

A rollable display apparatus includes a flexible panel including a main panel with a display and a dummy panel with a wire connected to the display, a housing to accommodate the flexible panel, a rotatable rolling drum in the housing and coupled to a first end of the flexible panel, a supporting base moveable into and out of the housing and coupled to a second end of the flexible panel, and a printed circuit board connected to the second end of the flexible panel, the printed circuit board being on the supporting base.

20 Claims, 11 Drawing Sheets

(56) References Cited

U.S. PATENT DOCUMENTS

| | | | |
|---|---|---|---|
| 2006/0034039 A1* | 2/2006 | Van Rens | G06F 1/1601 |
| | | | 361/679.29 |
| 2013/0127799 A1 | 5/2013 | Lee | |
| 2015/0268914 A1 | 9/2015 | Kim et al. | |
| 2018/0014417 A1* | 1/2018 | Seo | H05K 1/0203 |

FOREIGN PATENT DOCUMENTS

| | | |
|---|---|---|
| KR | 10-2013-0055263 A | 5/2013 |
| KR | 10-2014-0101611 A | 8/2014 |
| KR | 10-2015-0110848 A | 10/2015 |

* cited by examiner

ROLLABLE DISPLAY APPARATUS

CROSS-REFERENCE TO RELATED APPLICATION

Korean Patent Application No. 10-2016-0079271, filed on Jun. 24, 2016, in the Korean Intellectual Property Office, and entitled: "Rollable Display Apparatus," is incorporated by reference herein in its entirety.

BACKGROUND

1. Field

One or more embodiments relate to a rollable display apparatus that may be rolled and unrolled as needed.

2. Description of the Related Art

For example, one of the characteristics of a display panel, e.g., an organic light-emitting display device, is flexibility. Thus, such a display panel may have a rollable structure in which the main body may be rolled and unrolled as needed for convenience of carrying.

SUMMARY

According to one or more embodiments, a rollable display apparatus includes a flexible panel including a main panel having arranged thereon a display and a dummy panel having arranged thereon a wire connected to the display; a housing configured to accommodate the flexible panel; a rolling drum rotatably installed in the housing and coupled with a first end of the flexible panel; a supporting base installed to be moved into and out of the housing and coupled to a second end of the flexible panel; and a printed circuit board connected to the second end of the flexible panel and installed on the supporting base.

The printed circuit board may include a first printed circuit board installed at the second end of the main panel, and a second printed circuit board installed at the second end of the dummy panel.

Pads for connection to the display and the wire may be arranged at the first ends and the second ends of the main panel and the dummy panel.

The first printed circuit board and the second printed circuit board may be connected to the pads at the second end of the main panel and the pads at the second end of the dummy panel, respectively.

The rollable display apparatus may further include first driving chips connected to the pads at the second end of the main panel and second driving chips connected to the pads at the second end of the dummy panel.

The rollable display apparatus may further include first flexible circuit boards interconnecting the first printed circuit board and the pads at the second end of the main panel and second flexible circuit boards and second flexible circuit boards interconnecting the second printed circuit board and the pads at the second end of the dummy panel, wherein the first driving chips may be mounted on the first flexible circuit boards and the second driving chips may be mounted on the second flexible circuit boards.

The first driving chips and the first printed circuit board may be directly connected to the pads at the second ends of the main panel, and the second driving chips and the second printed circuit board may be directly connected to the pads at the second ends of the dummy panel.

The rollable display apparatus may further include third printed circuit boards interconnecting the pads at the first ends of the main panel and the pads at the first ends of the dummy panel.

The rollable display apparatus may further include a conductive capping layer arranged over the pads.

The main panel may further include a first base substrate on which is arranged the display and a first protection film that covers the display, and the dummy panel may further include a second base substrate having arranged thereon the wire and a second protection film that covers the wire.

The dummy panel may further include a black layer that suppresses light transmission.

The black layer may include a layer separately arranged on the second base substrate.

The second base substrate may be configured to be the black layer.

The flexible panel may further include heat dissipating wires.

The heat dissipating wires may be arranged at the center portion of the dummy panel.

The main panel and the dummy panel may be attached to each other via an adhesive film.

The supporting base may include a moveable base, the flexible panel extending along the moveable base, and a head perpendicular to the base, the printed circuit board being in the head.

The head may include rigid material.

The head may be at an edge of the moveable base and is external to the housing.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
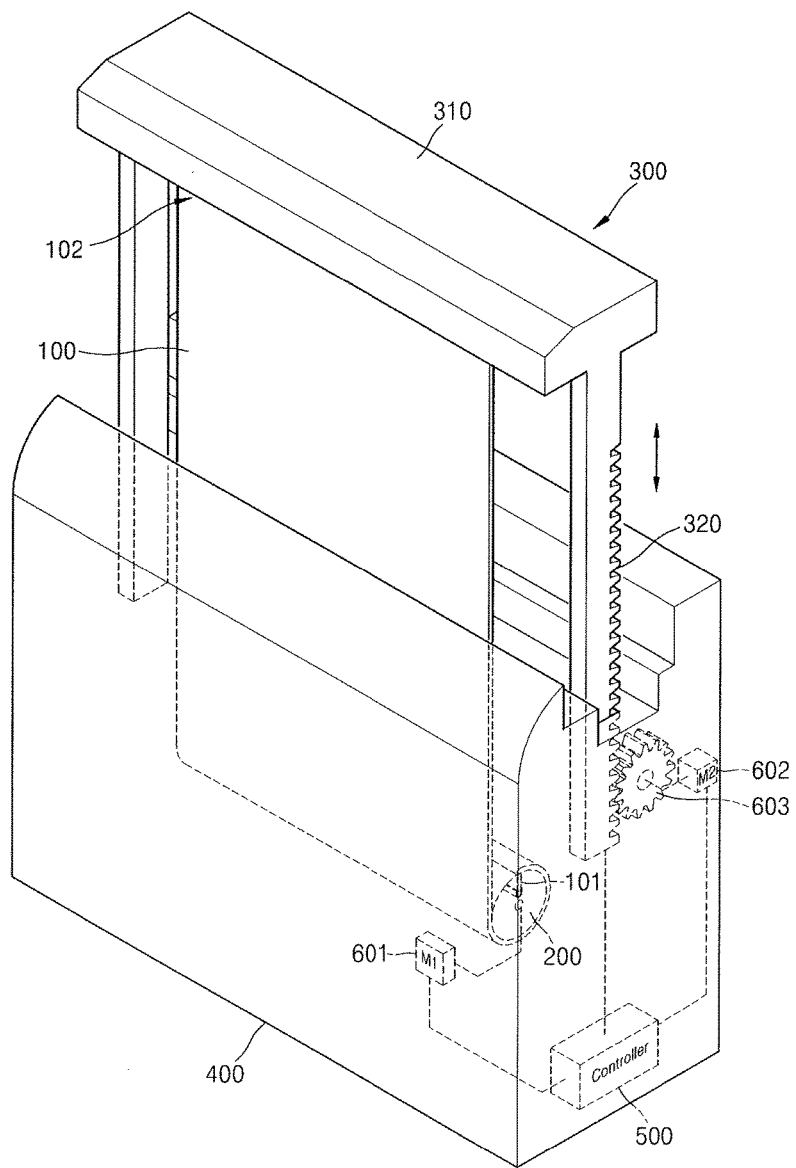
FIG. 1 illustrates a diagram of a rollable display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

FIG. 1 is a diagram showing a rollable display apparatus according to an embodiment.

Referring to FIG. 1, a rollable display apparatus may include a flexible panel 100 that is a display panel that may be bent flexibly. The flexible panel 100 is a structure in which a thin-film transistor and a light-emitting element for forming an image on a flexible substrate and an encapsulating layer for covering and protecting the flexible substrate 100 and the light-emitting element are stacked. Since a flexible substrate is used instead of a rigid glass substrate, the flexible panel 100 may be rolled, i.e., wound and unwound. For example, an organic light-emitting display device may become the flexible panel 100.

The reference numeral 200 denotes a rolling drum rotatably installed in a housing 400, so that the flexible panel 100 may be wound around the rolling drum 200. A first end 101 of the flexible panel 100 is coupled to the rolling drum 200, and the flexible panel 100 is wound around the outer peripheral surface of the rolling drum 200 or unwound therefrom as the rolling drum 200 is rotated. A second end 102 of the flexible panel 100 is coupled to a head 310 of a supporting base 300, which is mounted in the housing 400 so as to be able to move up and down. For example, the head 310 of the supporting base 300 may be used as a handle to pull the flexible panel 100 out of or into the housing 400.

When a first motor 601 rotates the rolling drum 200 in the unwinding direction and a second motor 602 drives the supporting base 300 in the upward direction, the flexible panel 100 is unwound out of the housing 400, and thus a user may see a flat unfolded screen. When the first motor 601 rotates the rolling drum 200 in the winding direction and the second motor 602 drives the supporting base 300 in the downward direction, the flexible panel 100 is wound into the housing 400 and is safely stored therein.

The reference numeral 320 denotes a rack arranged on the supporting base 300 and the reference number 603 denotes a pinion for transmitting power of the second motor 602 to the rack 320. The reference numeral 500 denotes a controller for controlling operation of the flexible panel 100 and operations of the first and second motors 601 and 602.

Figure 2:
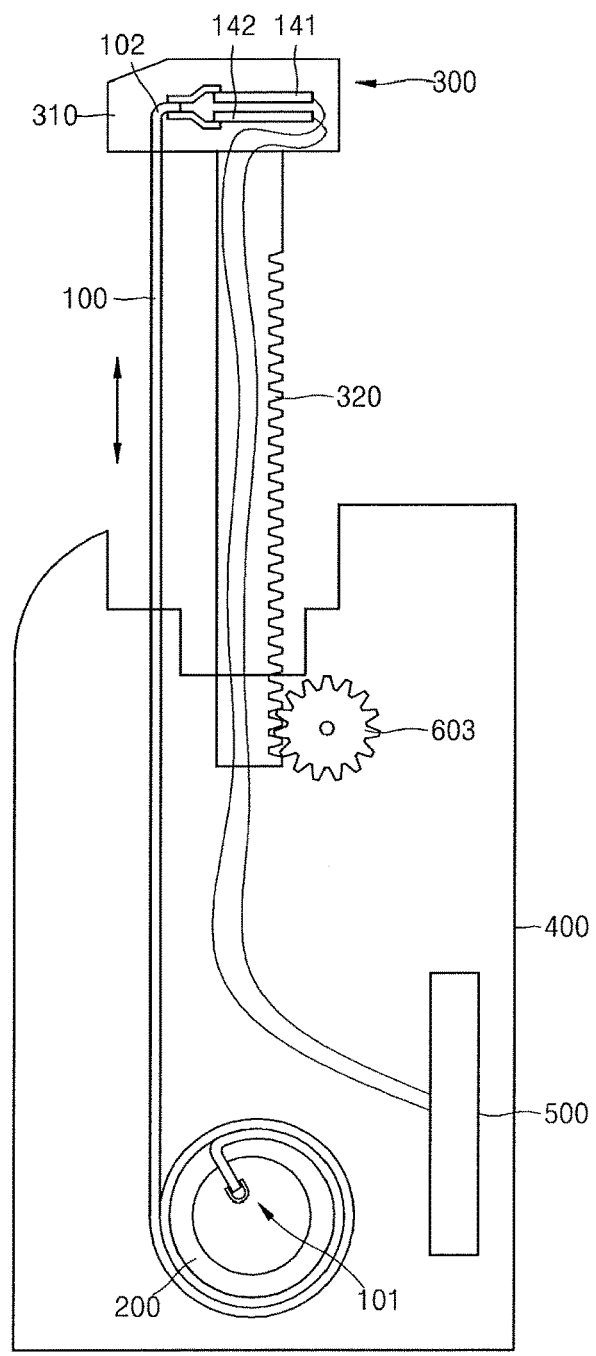
FIG. 2 illustrates a schematic lateral cross-sectional view of a rollable display panel of FIG. 1.

FIG. 2 is a schematic lateral cross-sectional view of the rollable display panel of FIG. 1. As described above, the first end 101 of the flexible panel 100 is fixed to the rolling drum 200, whereas the second end 102 of the flexible panel 100 is fixed to the head 310 of the supporting base 300. Furthermore, a first printed circuit board 141 and a second printed circuit board 142 are provided as connectors for connecting the flexible panel 100 and the controller 500 to each other, where the first and second printed circuit boards 141 and 142 are connected to the second end 102 of the flexible panel 100 and are accommodated inside the head 310. In this case, the first and second printed circuit boards 141 and 142 including a rigid material are located at the second end 102 of the flexible panel 100 that is not wound around the rolling drum 200, and thus the flexible panel 100 may be smoothly rolled. In other words, by arranging the first and second printed circuit boards 141 and 142, which include a rigid material, outside a winding area of the outer circumferential surface of the rolling drum 200, winding and unwinding of the flexible panel 100 may be smoothly performed.

Hereinafter, referring to FIGS. 3 and 4, the detailed structure of the flexible panel 100 and the structure of the connectors including the first and second printed circuit boards 141 and 142 will be described.

Figure 3:
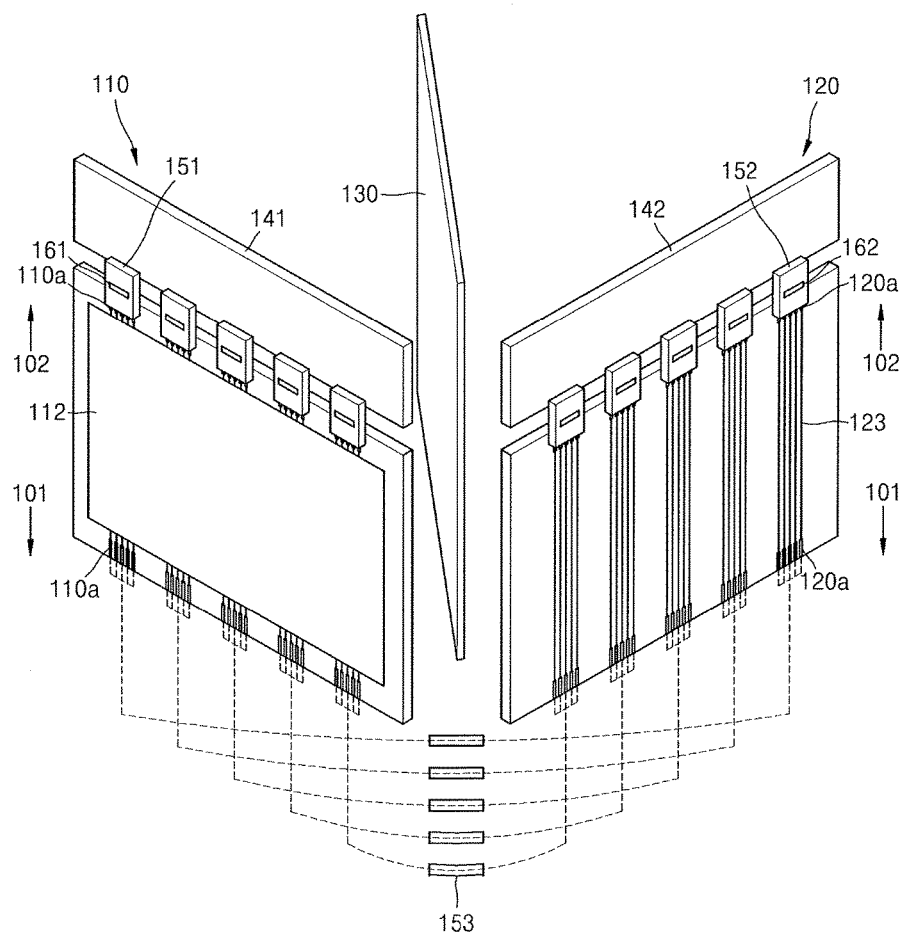
FIG. 3 illustrates an exploded perspective view of a flexible panel shown in FIG. 2.

First, as shown in FIG. 3, the flexible panel 100 includes a main panel 110 in which a display 112 is arranged, a dummy panel 120 in which a wire 123 is arranged, and an adhesive film 130 for attaching the two panels 110 and 120 to each other. As shown in FIG. 4, a first protection layer 113 and a second protection layer 124 cover the display 112 and the wire 123, respectively. However, in FIG. 3, the first protection layer 113 and the second protection layer 124 are omitted to clearly illustrate the display 112 and the wire 123.

The first and second printed circuit boards 141 and 142 are connected to the second end 102 of the main panel 110 and a second end 102 of the dummy panel 120, respectively. In other words, the first and second printed circuit boards 141 and 142 are connected to the same side ends of the two panels 110 and 120. As a result, the first and second printed circuit boards 141 and 142 are located next to each other on a same side after the two panels 110 and 120 are attached to each other, as illustrated in FIG. 4. When the first and second printed circuit boards 141 and 142 located on the same side are fixed to the head 310 of the supporting base 300, an efficient structure in which the first and second printed circuit boards 141 and 142 do not interrupt a rolling operation at all may be embodied. Further, the first and second printed circuit boards 141 and 142 are also prevented from being damaged.

Furthermore, pads 110a for connection to the display 112 are arranged at the first end 101 and the second end 102 of the main panel 110, and pads 120a for connection to the wire 123 are arranged at a first end 101 and the second end 102 of the dummy panel 120. The first printed circuit board 141 is connected to the pads 110a at the second end 102 of the main panel 110 through first flexible circuit boards 151, whereas the second printed circuit board 142 is connected to the pads 120a at the second end 102 of the dummy panel 120 through second flexible printed circuit boards 152. Furthermore, first driving chips 161 are mounted on the first flexible circuit boards 151, whereas second driving chips 162 are mounted on the second flexible circuit boards 152. In other words, the first and second driving chips 161 and 162, which include a rigid material like the first and second printed circuit boards 141 and 142, are also arranged at the sides on which the first and second printed circuit boards 141 and 142 are located and are fixed to the head 310 of the supporting base 300, as shown in FIG. 2, thereby providing the same effect as the first and second printed circuit boards 141 and 142 of smooth rolling and prevention of damages.

The pads 110a at the first end 101 of the main panel 110 and the pads 120a at the first end 101 of the dummy panel 120 are connected to each other via third flexible circuit boards 153. In this case, the first printed circuit board 141 and the first drive chip 161 are connected to the second end 102 of the display 112, whereas the second printed circuit board 142 and the second drive chip 162 are connected to the first end 101 of the display 112 via the wire 123 of the dummy panel 120 and the third flexible circuit boards 153.

In a display with a large screen, when a connection structure for connecting a power source only to one side of the display 112 is arranged, a voltage drop may be significant at a location far from the connection structure. Therefore, in order to prevent a voltage drop, connection structures are arranged on both sides of the display 112. However, when the second printed circuit board 142 and the second driving chip 162 are arranged directly at the first end 101 of the main panel 110, it may be difficult to wind the flexible panel 100 around the rolling drum 200. Therefore, the dummy panel 120 is provided as described above and the first and second printed circuit boards 141 and 142 and the first and second driving chips 161 and 162 are arranged on one side for voltage drop suppression and smooth rolling.

Figure 4:
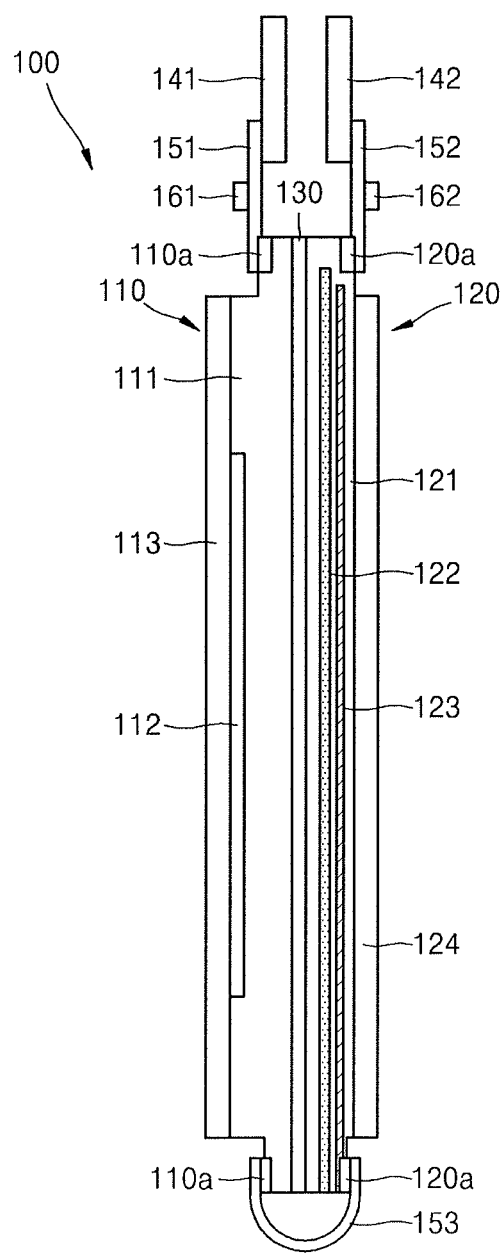
FIG. 4 illustrates a sectional diagram of a coupled state of the flexible panel shown in FIG. 3.
Figure 5A:
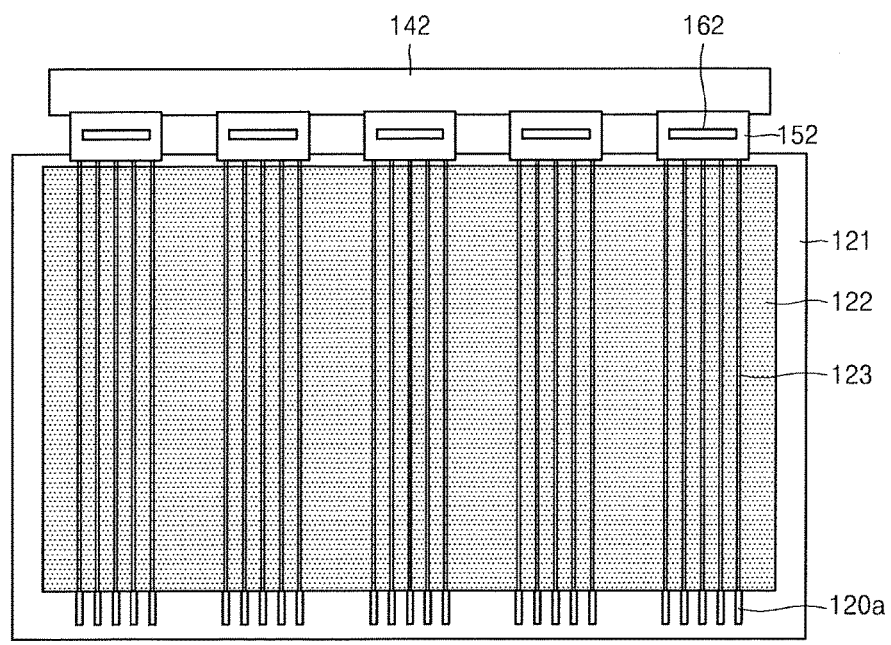
FIGS. 5A and 5B illustrate a plan view and a cross-sectional view, respectively, of a dummy panel of the flexible panel shown in FIG. 2.
Figure 5B:
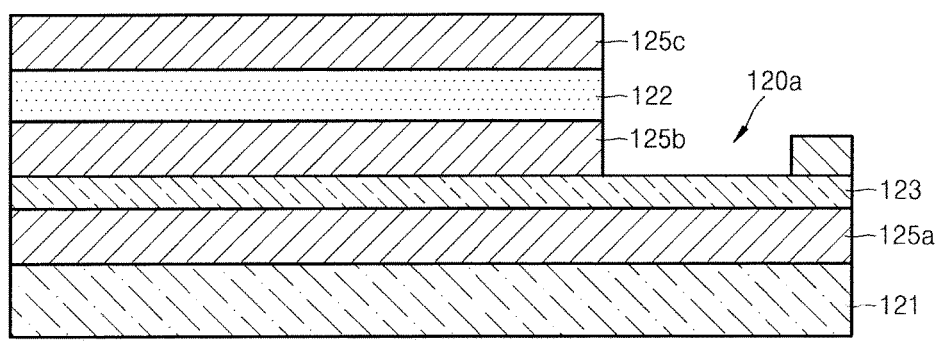

The reference numeral 122 in FIG. 4 denotes a black layer for suppressing light transmission. The black layer 122 is a layer including a material such as a black organic/inorganic material, a metal, an alloy, a semiconductor, etc., and suppresses transmission of light for easily embodying black color through the display 112. Therefore, as shown in FIGS. 5A and 5B, the black layer 122 covers most of a base substrate 121 (hereinafter, referred to as a second base substrate 121) of the dummy panel 120 so as to fully cover the display area 112, where the black layer 122 and the wire 123 are arranged on different layers around an insulation layer 125b. The reference numerals 125a and 125c also denote insulation layers.

Various modifications may be made in the structure of the black layer 122 and the structure of the pads 120a. Detailed descriptions thereof will be given below. First, referring to FIG. 14, the structure of an organic light-emitting display device, which is an example of the display 112, will be briefly described.

Figure 14:
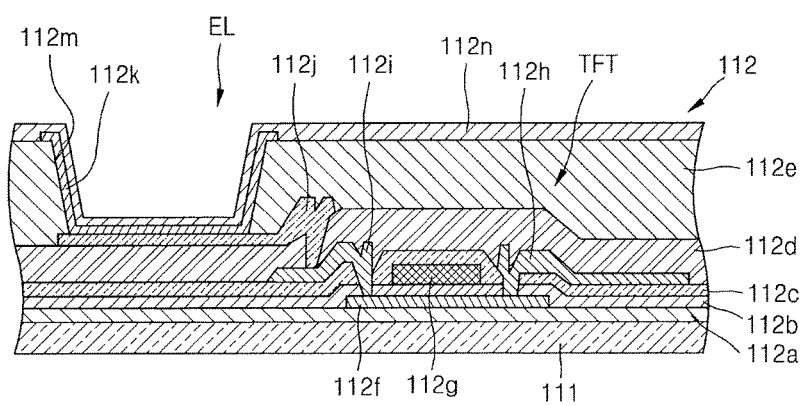
FIG. 14 illustrates a cross-sectional view of a display of a main panel in FIG. 2.

Referring to FIG. 14, the display 112 may include a thin-film transistor TFT and an organic light-emitting device EL. In detail, an active layer 112f is arranged on a buffer layer 112a adjacent to a base substrate 111 (hereinafter, referred to as a first base substrate 111), and the active layer 112f includes a source area and a drain area that are densely doped with an N-type or P-type impurity. The active layer 112f may also include an oxide semiconductor. For example, the oxide semiconductor may be include an oxide of one of Group XII, XIII, or XIV metals, e.g., zinc (Zn), indium (In), gallium (Ga), tin (Sn), cadmium (Cd), germanium (Ge), or hafnium (Hf), and combinations thereof. For example, the active layer 111f may include a G-I—Z—O[$(In_2O_3)a(Ga_2O_3)b(ZnO)c$] (a, b and c are real numbers respectively satisfying conditions of a≥0, b≥0, and c≥0). A gate electrode 112g is arranged above the active layer 112f with a gate insulating film 112b interposed therebetween. A source electrode 112h and a drain electrode 112i are arranged above the gate electrode 112g. An interlayer insulating film 112c is arranged between the gate electrode 112g and the source electrode 112h and the drain electrode 112i, and a passivation film 112d is interposed between the source electrode 112h and the drain electrode 112i and an anode 112j of the organic light-emitting device EL.

An insulating planarizing film 112e including an acryl or the like is arranged on the anode 112j. After a certain opening 112m is arranged in the insulating planarizing film 112e, the organic light-emitting device EL is arranged.

The organic light-emitting device EL emits red, green, and blue light according to a current flow to display certain image data. The organic light-emitting device EL includes the anode 112j that is connected to the drain electrode 112i of the thin-film transistor TFT and receives positive power therefrom, a cathode 112n that is arranged to cover an entire pixel and provides negative power, and an emission layer 112k that is arranged between the anode 112j and the cathode 112n and emits light.

A hole injection layer (HIL) a hole transport layer (HTL), an electron transport layer (ETL), and an electron injection layer (EIL) may be stacked adjacent to the emission layer 112k. Here, the emission layer 112k may be arranged separately in each pixel, such that pixels emitting red, green, and blue light are gathered to constitute one unit pixel. Alternatively, an emission layer may be arranged in common throughout the entire pixel area regardless of positions of pixels. Here, the emission layer may be arranged by vertically stacking or mixing layers including emission materials emitting red, green, and blue light, for example. Of course, when the emission layer may emit white light, different color combinations may be employed. Furthermore, a color converting layer or a color filter for converting the emitted white light to light of a certain color may be further arranged.

A thin-film encapsulation layer (not shown) in which an organic film and an inorganic film are alternately stacked may be arranged on the cathode 112n.

The power source is connected to both a first end and a second end of the display 112 having a structure as described above, to form an image while suppressing a voltage drop.

A rollable display apparatus as described above may be used, for example, as follows. As shown in FIG. 1, the controller 500 moves the first and second motors 601 and 602 in the unfolding direction to move the supporting base 300 upward and rotates the rolling drum 200 in the unwinding direction. As a result, the flexible panel 100 wound around the rolling drum 200 is unfolded out of the housing 400 as the supporting base 300 is moved upward. Therefore, a user may watch an image via the display 112 of the flexible panel 100 that is unfolded flat.

When the display device is to be stored or transported, for example, the first and second motors 601 and 602 are reversely driven, thereby rotating the rolling drum 200 in the winding direction moving the supporting base 300 downward. As a result, the flexible panel 100 is wound around the outer circumferential surface of the rolling drum 200 and is safely protected in the housing 400.

Further, since the first and second printed circuit boards 141 and 142 or the first and second driving chips 161 and 162 do not interrupt operations for winding and unwinding releasing the flexible panel 100 onto and from the outer peripheral surface of the rolling drum 200 at all, the flexible panel 100 may be smoothly rolled without damaging the first and second printed circuit boards 141 and 142 and the first and second driving chips 161 and 162. Furthermore, since power may be supplied to both sides of the display 112, a voltage drop may be prevented.

Meanwhile, various modified structures may be embodied from the above-described embodiment. Hereinafter, such modified structures will be described.

Figure 6:
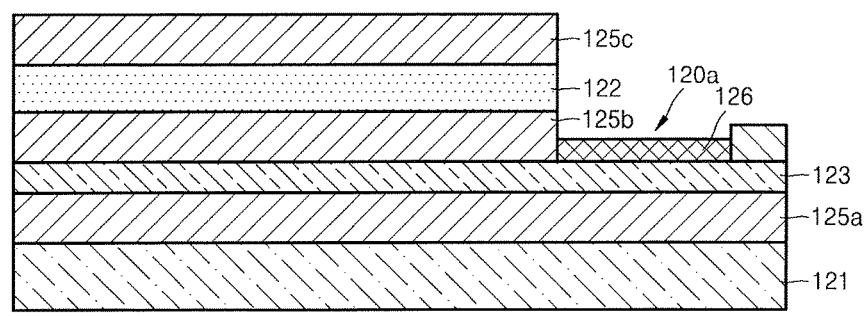
FIGS. 6, 7A, 7B, 8, 9A, 9B, 10, 11A, 11B, 12, and 13 illustrate plan views and cross-sectional views of various modified structures of the dummy panel in FIGS. 5A and 5B.

FIG. 5B shows a structure in which the pad 120a is exposed to the outside as a terminal portion connected to the wire 123. However, as shown in FIG. 6, a conductive capping layer 126 including a metal or ITO may be further arranged thereon. The same may be applied not only to the pads 120a on at both ends of the dummy panel 120, but also to the pads 110a at both ends of the main panel 110.

Figure 7A:
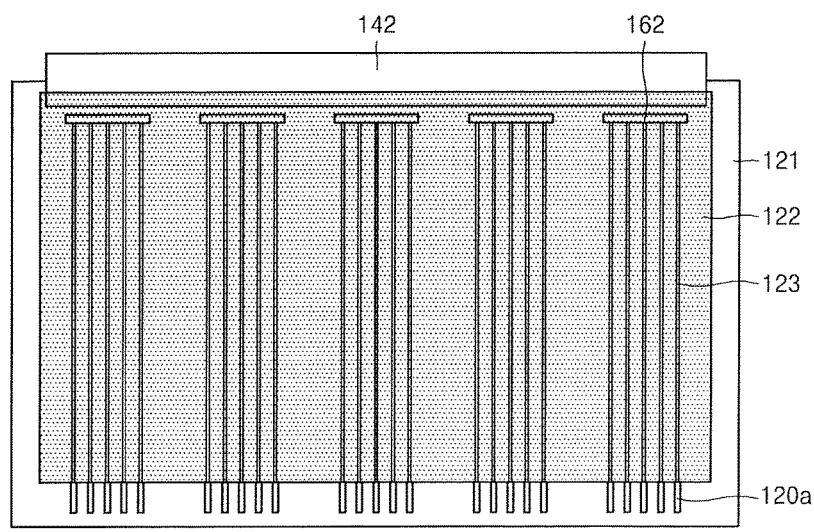
Figure 7B:
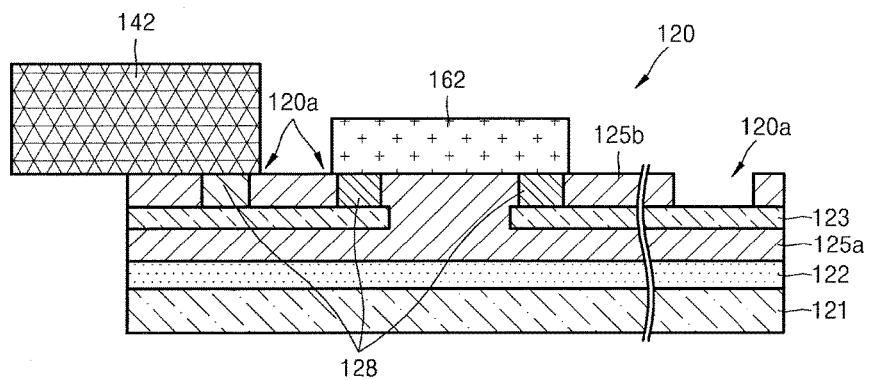

Furthermore, FIGS. 5A and 5B show a structure in which the second printed circuit board 142 and the second drive chip 162 are connected to the dummy panel 120 via the second flexible circuit board 152. However, as shown in FIGS. 7A and 7B, the second flexible printed circuit board 152 may be omitted and the second printed circuit board 142 and the second driving chip 162 may be directly connected to the dummy panel 120. The reference numeral 128 denotes a conductive adhesive. Of course, the first flexible circuit board 151 of the main panel 110 may also be omitted in the same regard.

Figure 8:
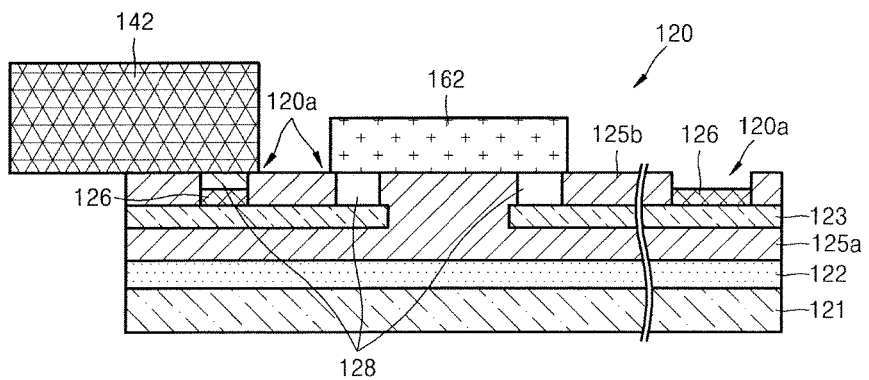

FIG. 8 shows that the conductive capping layer 126 may be further added to the pad 120*a* of FIG. 7B as in FIG. 6.

Figure 9A:
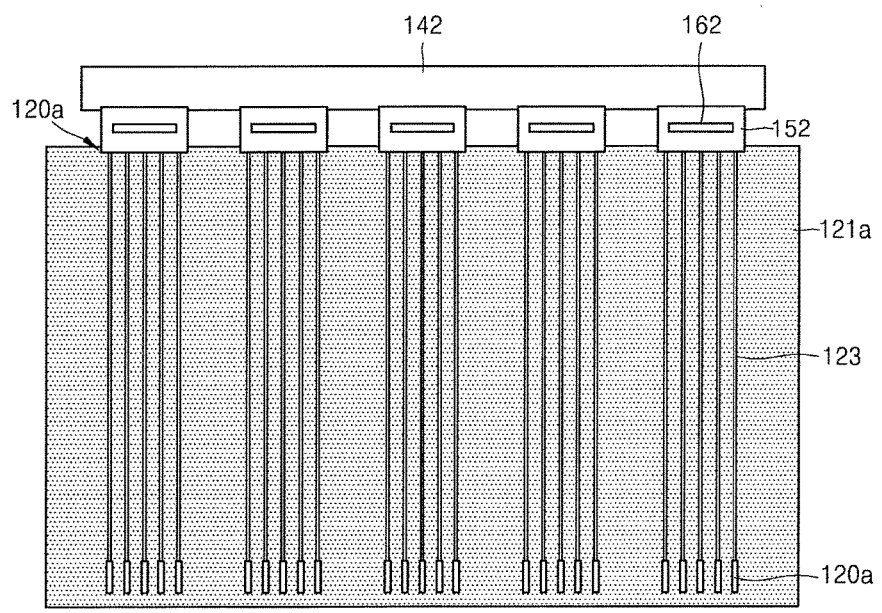
Figure 9B:
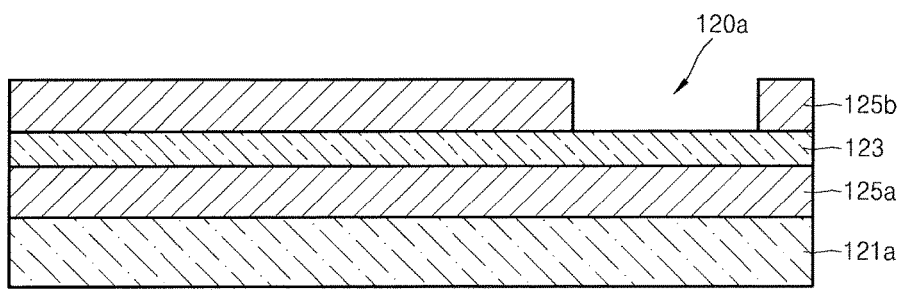

Furthermore, as shown in FIGS. 9A and 9B, a second base substrate 121*a* itself may include a black layer material. In other words, in the above-described embodiment, the black layer 122 is arranged on the second base substrate 121. However, the second base substrate 121*a* itself may also include a black layer material according to the present embodiment.

Figure 10:
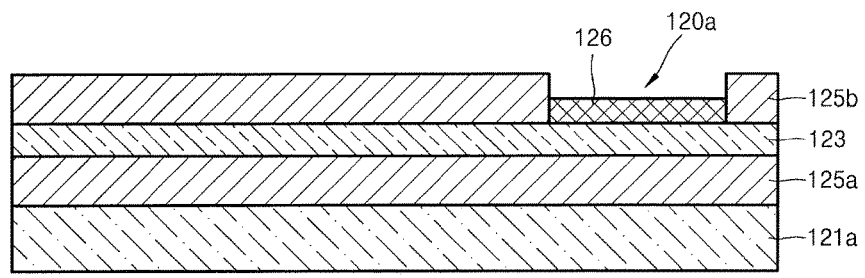

FIG. 10 shows that the conductive capping layer 126 may be added to the pad 120*a* of FIG. 9B as in FIG. 6.

Figure 11A:
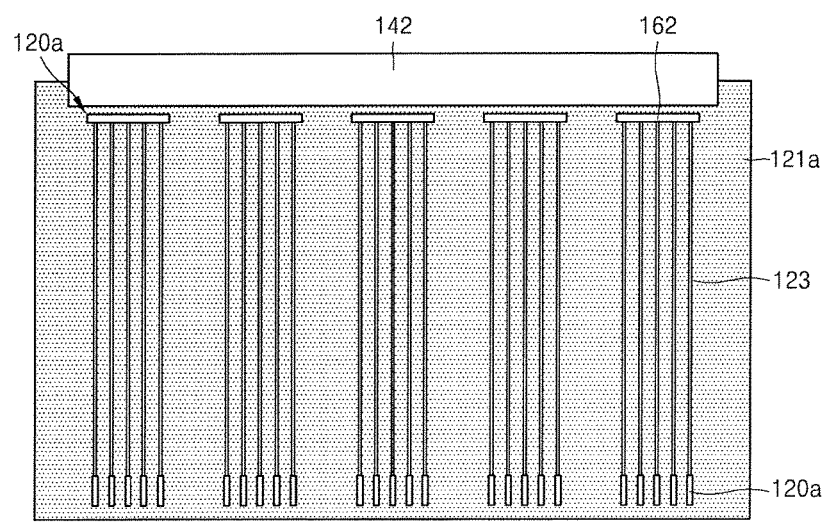
Figure 11B:
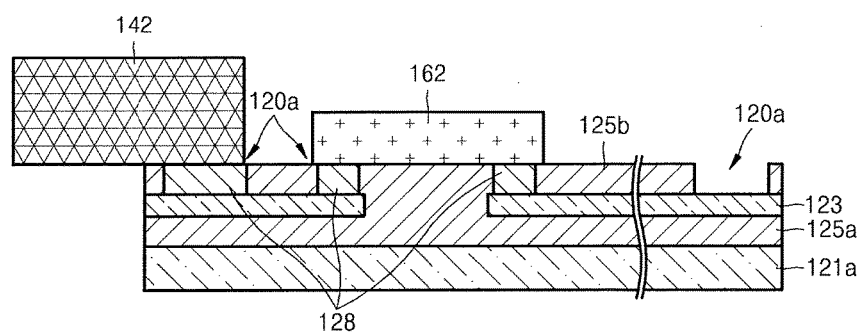
Figure 12:
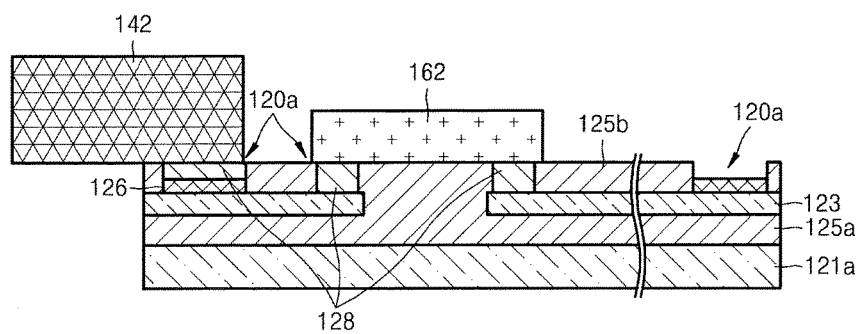

FIGS. 11A and 11B show a structure in which the second flexible printed circuit board 152 is omitted as shown in FIGS. 7A and 7B while the second base substrate 121*a* including a black layer material is employed as shown in FIGS. 9A and 9B. Furthermore, FIG. 12 shows a structure in which the conductive capping layer 126 is further arranged on the pad 120*a* as shown in FIG. 8. In other words, the modified structures may also be combined in various ways.

Figure 13:
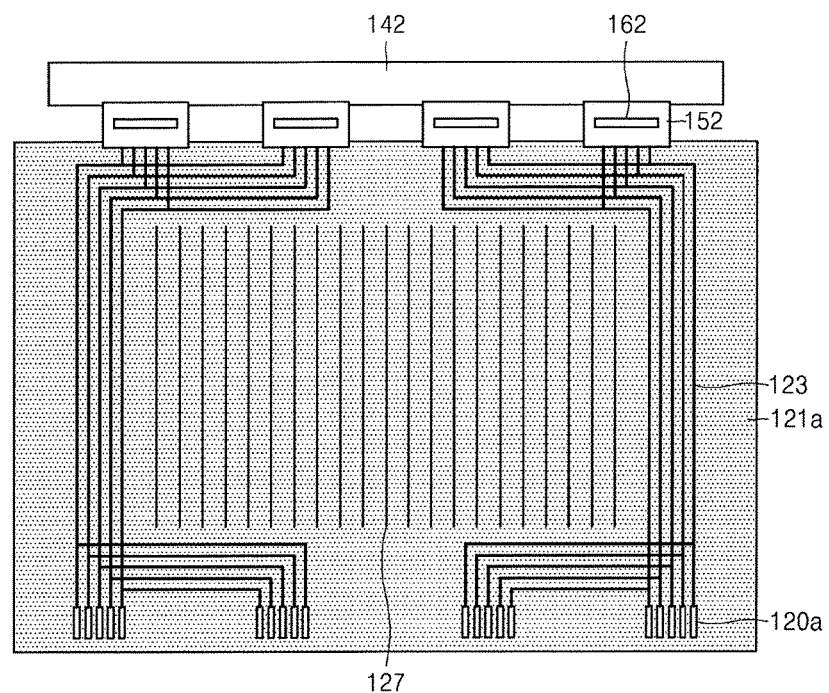

FIG. 13 shows a structure in which heat dissipating wires 127 are arranged at the center portion of the second base substrate 121*a* of the dummy panel 120, where the second base substrate 121*a* includes a black layer material. The heat dissipating wire 127 is a printed metal wire including a highly heat-conductive material, such as Al or Cu, and helps heat generated by the flexible panel 100 to be dissipated quickly. Here, although FIG. 13 shows that the heat dissipating wire 127 is arranged on the second base substrate 121*a* including a black layer material, the heat dissipating wire 127 may also be arranged on the second base substrate 121 as shown in FIG. 5A.

By way of summation and review, in order to implement smooth operation of a rollable structure of a flexible display device, it is necessary to efficiently arrange a connection structure for electrically connecting a flexible panel, e.g., an organic light-emitting display device, to a controller. For example, since a rigid member, e.g., a driving chip or a printed circuit board, which is difficult to roll, is arranged between the flexible panel and the controller, it may be difficult to properly implement a rollable display apparatus.

Therefore, one or more embodiments include a rollable display apparatus enhanced to be rolled smoothly. That is, a rollable display apparatus according to embodiments includes a rolling structure with a rigid connecting portion positioned at an unrollable portion of the display apparatus between the flexible panel and the controller, so the rollable display apparatus may be smoothly rolled without risk of damaging the connecting portion and without causing a voltage drop. As a result, a highly reliable rollable display apparatus may be manufactured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A rollable display apparatus, comprising:
   a flexible panel including a main panel with a display and a dummy panel with a wire connected to the display;
   a housing to accommodate the flexible panel;
   a rotatable rolling drum in the housing and coupled to a first end of the flexible panel;
   a supporting base moveable into and out of the housing and coupled to a second end of the flexible panel; and
   a printed circuit board connected to the second end of the flexible panel, the printed circuit board being on the supporting base.

2. The rollable display apparatus as claimed in claim 1, wherein the printed circuit board includes:
   a first printed circuit board at a second end of the main panel; and
   a second printed circuit board at a second end of the dummy panel.

3. The rollable display apparatus as claimed in claim 2, wherein pads arranged at first ends of the main panel and the dummy panel and the second ends of the main panel and the dummy panel, respectively, the pads being connected to the display and the wire, respectively.

4. The rollable display apparatus as claimed in claim 3, wherein the first printed circuit board and the second printed circuit board are connected to the pads at the second end of the main panel and to the pads at the second end of the dummy panel, respectively.

5. The rollable display apparatus as claimed in claim 4, further comprising first driving chips connected to the pads at the second end of the main panel and second driving chips connected to the pads at the second end of the dummy panel.

6. The rollable display apparatus as claimed in claim 5, further comprising first flexible circuit boards interconnecting the first printed circuit board and the pads at the second end of the main panel, and second flexible circuit boards and second flexible circuit boards interconnecting the second printed circuit board and the pads at the second end of the dummy panel,
   wherein the first driving chips are on the first flexible circuit boards, and the second driving chips are on the second flexible circuit boards.

7. The rollable display apparatus as claimed in claim 5, wherein the first driving chips and the first printed circuit board are directly connected to the pads at the second end of the main panel, and the second driving chips and the second printed circuit board are directly connected to the pads at the second end of the dummy panel.

8. The rollable display apparatus as claimed in claim 3, further comprising third printed circuit boards interconnecting the pads at the first end of the main panel and the pads at the first end of the dummy panel.

9. The rollable display apparatus as claimed in claim 3, further comprising a conductive capping layer arranged over the pads of the main panel and the dummy panel.

10. The rollable display apparatus as claimed in claim 1, wherein:

the main panel further comprises a first base substrate, on which the display is arranged, and a first protection film that covers the display, and the dummy panel further comprises a second base substrate, on which the wire is arranged, and a second protection film that covers the wire.

11. The rollable display apparatus as claimed in claim 10, wherein the dummy panel further comprises a black layer to suppress light transmission.

12. The rollable display apparatus as claimed in claim 11, wherein the black layer includes a layer separately arranged on the second base substrate.

13. The rollable display apparatus as claimed in claim 11, wherein the second base substrate is the black layer.

14. The rollable display apparatus as claimed in claim 1, wherein the flexible panel further comprises heat dissipating wires.

15. The rollable display apparatus as claimed in claim 14, wherein the heat dissipating wires are arranged at a center portion of the dummy panel.

16. The rollable display apparatus as claimed in claim 1, wherein the main panel and the dummy panel are attached to each other via an adhesive film.

17. The rollable display apparatus as claimed in claim 1, wherein the supporting base includes
a head, the printed circuit board being in the head.

18. The rollable display apparatus as claimed in claim 17, wherein the head includes rigid material.

19. The rollable display apparatus as claimed in claim 17, wherein the head is external to the housing.

20. The rollable display apparatus as claimed in claim 17, wherein a rigid portion of the printed circuit board is entirely within the head.

* * * * *